United States Patent [19]

Niki et al.

[11] Patent Number: 4,967,261

[45] Date of Patent: Oct. 30, 1990

[54] TAPE CARRIER FOR ASSEMBLING AN IC CHIP ON A SUBSTRATE

[75] Inventors: Kenichi Niki; Toru Kokogawa; Hayato Takasago, all of Amagasaki, Japan

[73] Assignee: Mitsubishi Denki Kabushiki Kaisha, Japan

[21] Appl. No.: 442,416

[22] Filed: Nov. 22, 1989

Related U.S. Application Data

[63] Continuation of Ser. No. 219,569, Jul. 15, 1988, abandoned.

[30] Foreign Application Priority Data

Jul. 30, 1987 [JP] Japan .................................. 62-191695
Aug. 24, 1987 [JP] Japan .................................. 62-208349

[51] Int. Cl.$^5$ ........................ H01L 23/48; H01L 23/12
[52] U.S. Cl. ........................................ 357/70; 357/80; 29/827
[58] Field of Search ................................ 357/69, 70, 80; 174/52.4; 439/67, 68, 69, 71; 29/827; 361/408, 403, 404, 405; 206/330

[56] References Cited

U.S. PATENT DOCUMENTS

| | | |
|---|---|---|
| 3,390,308 | 6/1968 | Marley .................................. 29/827 |
| 3,838,984 | 10/1974 | Crane et al. ......................... 29/193.5 |
| 4,363,076 | 12/1982 | McIver ................................. 361/408 |
| 4,792,532 | 12/1988 | Ohtani et al. ........................ 206/330 |
| 4,801,999 | 1/1989 | Hayward et al. ..................... 357/70 |

Primary Examiner—Neil Abrams
Attorney, Agent, or Firm—Leydig, Voit & Mayer

[57] ABSTRACT

A tape carrier for mounting and bonding an IC chip on substrate having an interconnection pattern is disclosed. The tape carrier comprises a peripheral and a central film portion made of an electrically insulating flexible material, and a set of leads carried at least one the peripheral film portion. The central portion covers the central area of the surface of the IC chip on which the bumps are formed. An aperture is formed between the peripheral and central film portion which has enough dimension to allow the leads to be bonded to the bumps of the IC chip therethrough. Some of the leads extend over the central film portion and, extending out of a side of the central film portion, reach the opposing area of the peripheral film portion across a strip of the aperture, thereby effecting electrical connection from the bumps to far-away portions of the circuitry on the substrate and between the bumps themselves. The central film portion may form an island separated from the peripheral potion by a ring-shaped aperture; alternatively, it may form a tongue-shaped appendage projecting into the aperture. The leads and the IC chip may be situated on the same surface of the film portions; alternatively, they may be situated on the opposite surfaces thereof.

12 Claims, 14 Drawing Sheets

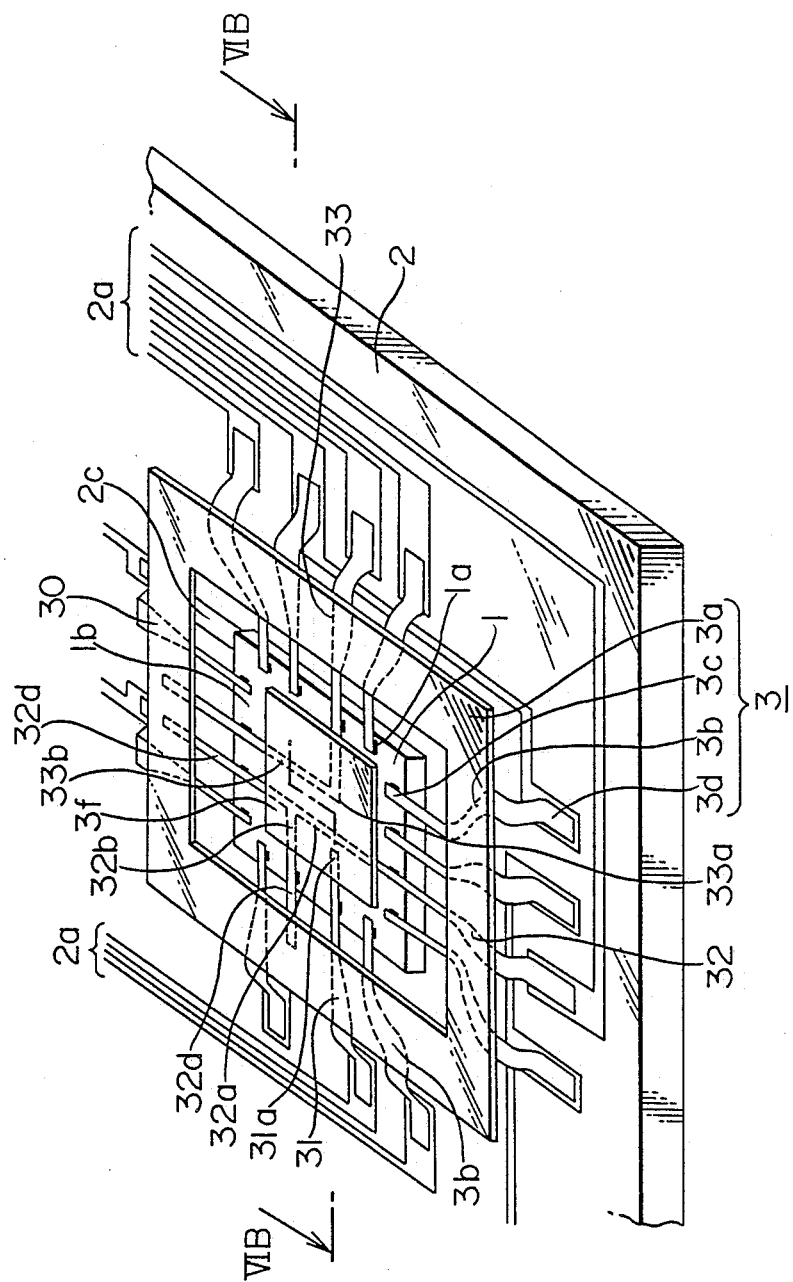

TAPE CARRIER FOR ASSEMBLING AN IC CHIP ON A SUBSTRATE

This application is a continuation of application Ser. No. 07/219,569, filed July 15, 1988.

BACKGROUND OF THE INVENTION

1. Field of the Invention

This invention relates to tape carriers for mounting and bonding a semiconductor chip on a substrate having interconnection circuitry, the tape carrier making electrical connections from the semiconductor chip having a pattern of electrodes formed on a main surface thereof to the circuitry formed on a substrate.

2. Description of the Related Art

Semiconductor chips, such as integrated circuit chips, have a plurality of projecting electrodes for making electrical connection to and from the chip. Such projecting electrodes or bumps are usually connected to a lead frame or a substrate having printed circuitry including interconnections by means of the wire bonding method. In recent years, however, wireless bonding methods are replacing the wire bonding method in certain areas of application. The tape automated bonding process utilizing tape carriers is one of the most promising and widely used among the wireless bonding methods.

FIG. 1 is a perspective view of an integrated circuit chip assembled on an electronic circuit board utilizing a conventional tape carrier, which is disclosed, for example, in Japanese Laid-Open patent applications 55-30859, 55-41775, 57-72360, 57-72361, and 58-1847451. The assemblage shown in FIG. 1 is as follows. An integrated circuit element or chip 1 having a plurality of projecting electrodes or bumps 1a, which are made, for example, of gold, and are formed on the upper surface thereof, is mounted on the electronic circuit substrate or board 2 on which an electrically conducting interconnection pattern 2a is formed. The bumps 1a are electrically connected to the terminal portions 2b of the conducting interconnection patterns 2a on the circuit board 2 through the finger-shaped leads 3b formed on the base film 3a, which together constitute the tape carrier 3. THe film 3a is made, for example, of a polyimide resin. The leads 3b are made of electrically conducting material such as copper foil and are carried on the film 3a. Inner lead portions 3c and outer lead portions 3d of the leads 3b extend horizontally from the square ring-shaped film 3a. The inner lead portions 3c are electrically connected to the bumps 1a and the outer lead portions 3d to the terminal portions 2b of the interconnection pattern 2a on the board 2. The circuit board 2 may be a printed circuit board or a liquid crystal display panel.

The assembling of the integrated circuits on circuit boards shown in FIG. 1 is effected as follows. The tape carrier utilized in the tape automated bonding process comprises an elongated tape-shaped film on which a sequence of lead patterns are formed. One pattern of the leads 3b of the sequence of such patterns is shown in FIG. 1. The tape-shaped film also has a sequence of patterns of apertures formed therein, each pattern of apertures forming a square ring-shaped film portion 3a carrying a set of leads 3b, as shown in FIG. 1. Thus, at the first stage of the assembly according to the tape automated bonding method, the inner lead portions 3c of the leads 3b, which are plated with tin, etc., are aligned on the bumps 1a on an integrated circuit chip 1, forwarding the elongated tape-shaped film. The inner lead portions 3c are then heated and pressed on the bumps 1a to form an alloy layer therebetween, so that the bumps 1a are bonded to the inner lead portions 3c of the leads 3b. As a result, the integrated circuit chip 1 is now carried by the tape-shaped film. Next, a square ring-shaped film and a pattern of leads are cut from the elongated tape-shaped film to obtain a set of leads 3b carried on the base film 3a as shown in FIG. 1. Further, the leads 3b are aligned on the corresponding terminal portions of the interconnection pattern 2a on the circuit board 2, and the outer lead portions 3d of the leads 3b are bonded thereto by means of soldering, etc.

The conventional assembling of the integrated circuit chips as described above has the following disadvantages. The leads 3b should be bonded to the bumps 1a at the inner lead portions 3c which are at the extreme end thereof. The leads 3b cannot be positioned and drawn over the upper main surface 1b of the integrated circuit chip 1. If portions of leads 3b are placed on the main upper surface 1b of the integrated circuit chip 1, on which circuit patterns, etc., are formed, an undesirable electrical contact may be formed between the leads 3b and the circuit patterns, etc., on the upper main surface 1b of the integrated circuit chip 1. Thus, the bumps 1a can only be electrically connected to the associated terminal portions of the interconnection pattern 2a of the board 2 which are situated in a close neighborhood of the bumps 1a to which they are connected.

The conventional assembling as described above has another disadvantage. Namely, if the input and output wirings to and from the integrated circuit chip which are coupled to the bumps 1a have a double layer structure, the interconnection patterns on 2a on the circuit board 2 should also have a double layer structure. It is, however, difficult to make the interconnection patterns double-layered when the electronic circuit board 2 is, for example, a liquid crystal display panel.

Thus, the conventional assembling of the integrated circuit chips as described above suffers grave limitations with regard to the possible electrical connections to and from the bumps thereof; the conventional method is not suited to a high-density assembling of the integrated circuit chips.

SUMMARY OF THE INVENTION

Thus, an object of the present invention is to provide a tape carrier for mounting and bonding a semiconductor chip on a circuit board or substrate which is capable of realizing a highly efficient and high-density assembling of the chips on the substrate.

Another object of the present invention is to provide a tape carrier which allows a wide choice of possible interconnection patterns between the bumps of the semiconductor chip and the circuitry on the substrate and among the bumps themselves.

A further object of the present invention is to provide a tape carrier by means of which a double-layered input and output wiring to and from the bumps of the semiconductor chip is possible even when the circuitry on the substrate does not allow a double-layered structure.

According to the present invention, a tape carrier for making electrical connections from a semiconductor chip to circuitry on a substrate is provided comprising a first and a second base film portion and a pattern of electrically conducting leads for making electrical connections between the bumps of the chip and the circuitry on the substrate. The first and second film portions are made of an electrically insulating flexible material, such as polyimide, and have an aperture formed therebetween which has a dimension allowing the bumps to be bonded to the leads therethrough. The leads are at least carried on the first film portion; at least some of the leads extend horizontally into an area on the second film portion. It is preferred that some of the leads extend across the second film portion and, extending from a side of the second film portion, reach an opposing area of the first film portion across a strip of the aperture therebetween, so that the bumps can be connected to portions of the circuitry on the substrate that are situated far away therefrom; such extensions of the leads also allow mutual connections of the bumps themselves. In one of the preferred embodiments of the present invention, the second film portion forms a tongue-shaped appendage projecting into the aperture between the first and the second film portion; in this embodiment, some of the leads extend across the tongue-shaped appendage and reach the bumps of the chip situated at a side of the process. Thus, these bumps can be electrically connected to portions of the circuitry on the substrate which are situated at sides of the chip different from that at which the bumps are situated.

BRIEF DESCRIPTION OF THE DRAWINGS

Further features and details of the present invention will become more clear in the following detailed description of the preferred embodiments, taken in conjunction with the accompanying drawings, in which:

FIGS. 2a and 2b show an integrated circuit chip assembled on an electronic circuit substrate utilizing a tape carrier according to the present invention, wherein FIG. 2a is a perspective view thereof and FIG. 2b is a sectional view thereof showing a cross section taken along the line IIB—IIB of FIG. 2a;

FIG. 5a through 5d show the fourth embodiment according to the present invention, wherein FIG. 5a is a perspective view of the integrated circuit chip assembled on a substrate by means of a tape carrier according to the present invention, FIGS. 5b and 5c are perspective views of the tape carrier, with or without the chip, at intermediate stages of assemblage, and FIG. 5d is a partial perspective view of the display panel substrate on which the chip is mounted;

FIGS. 6a to 6b are views similar to those of FIGS. 2a and 2b, respectively, showing a fifth embodiment according to the present invention similar to that of FIGS. 2a and 2b, wherein FIG. 6b shows the cross section taken along line VIB—VIB of FIG. 6a;

In the drawings, like reference numerals represent like or corresponding elements or portions.

DETAILED DESCRIPTION OF THE PREFERRED EMBODIMENTS

Figure 1:
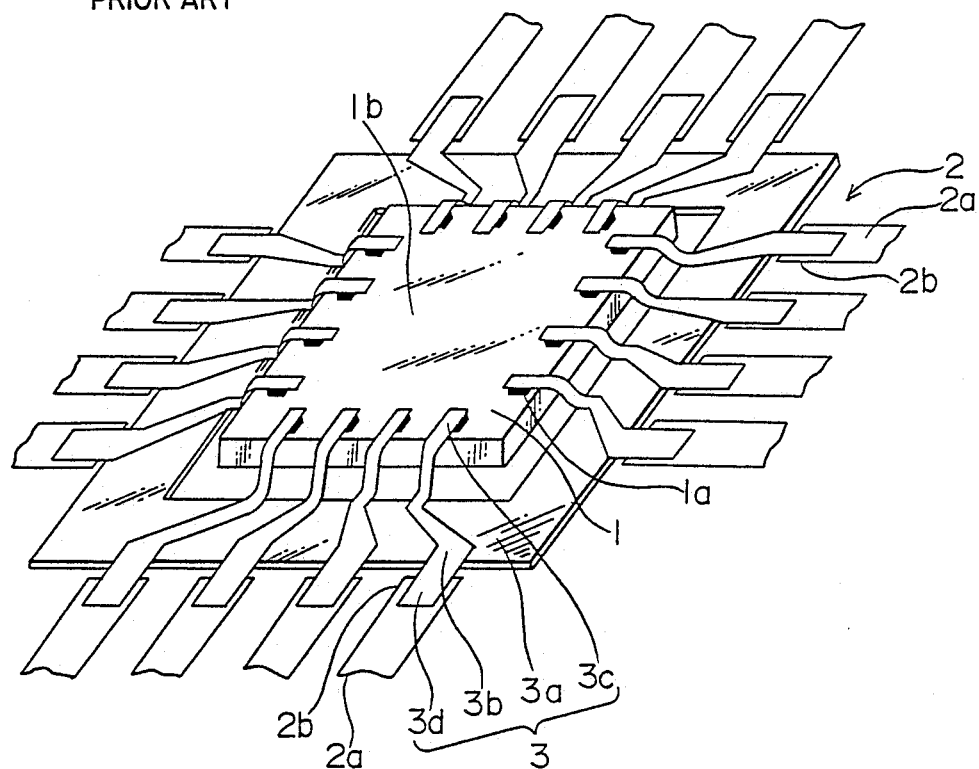
FIG. 1 is a perspective view of an integrated circuit chip assembled on an electronic circuit substrate utilizing a conventional tape carrier.
Figure 2B:
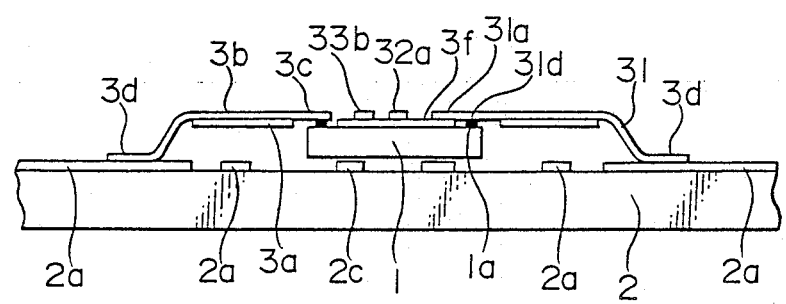
Figure 2A:
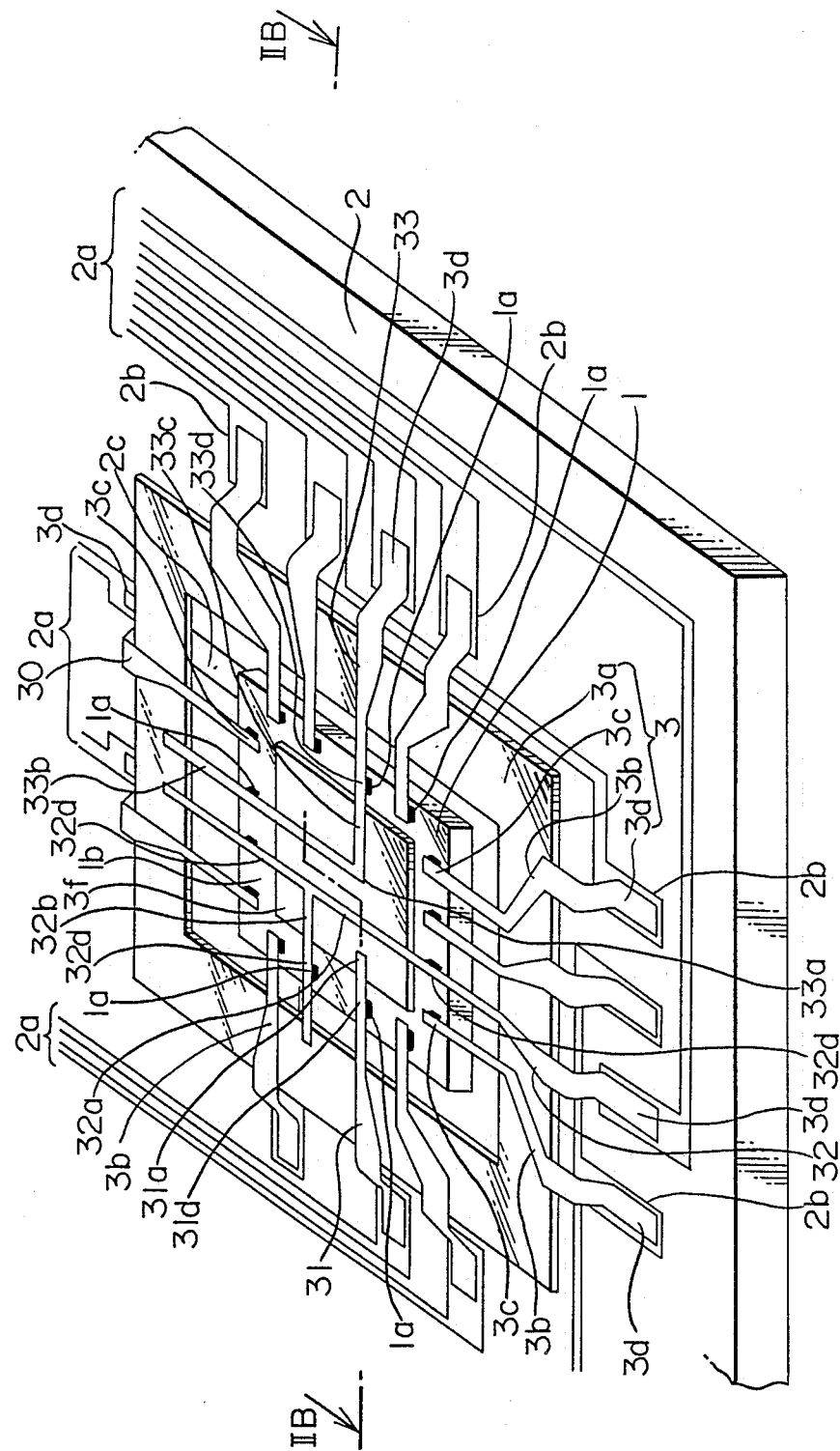

Referring now to FIGS. 2a and 2b of the drawings, the first embodiment according to the present invention is described. FIGS. 2a and 2b show an integrated circuit chip assembled on an electronic circuit board utilizing a tape carrier which is the first embodiment according to the present invention.

An integrated circuit element or chip 1 has a plurality of projecting electrodes or bumps 1a at the peripheral areas of the upper main surface 1b thereof, the bumps 1a being made, for example, of gold. The chip 1 is mounted on an electronic circuit board 2 on which an electrically conducting interconnection pattern 2a is formed. The circuit board 2 may be a printed circuit board or a liquid crystal display panel.

The tape carrier 3 according to the present invention comprises a plurality of leads 3b and 30 and 33 made of an electrically conducting material such as copper foil, and a square ring-shaped peripheral base film portion 3a and a central base film portion 3f carrying the leads 3b. The central base film portion 3f has the form of a square and is positioned on the upper main surface of the integrated circuit chip 1 on which circuit patterns, etc., are formed. Both peripheral and central base film portions 3a and 3f are made of a polyimide resin which has a good heat-resistant property. Some of the leads 3b are simply finger-shaped and are bonded to an associated bump 1a on the chip 1 and a terminal portion 2b of the conducting interconnection pattern 2a on the circuit board 2 at the inner lead portion 3c and the outer lead portion 3d thereof, respectively, which are situated at the extreme ends of such leads 3b. There is also a lead 30 which is simply finger-shaped, but the outer lead portion 3d thereof is bonded to a middle portion of a line 2c of the interconnection pattern 2a extending horizontally under the base film portion 3a and the integrated circuit chip 1. Further, there are leads 31 through 33 which have extensions 31a through 33a, respectively, which extend horizontally above the central base film portion 3f. One lead 31 has a small extension 31a which is bonded to the associated bump 1a in the middle portion thereof bridging the peripheral and central base film portions 3a and 3f. Another lead 32 has an extension 32a which extends across the central base film portion 3f to the opposite side of the square ring-shaped peripheral base film portion 3a, the extension 32a having a side branch 32b extending at right angles from a middle portion thereof to extend from a side of the central base film portion 3f to the opposing side of the square ring-shaped peripheral base film portion 3a. Still another lead 33 has an L-shaped extension 33a, the branch portion 33b thereof extending at right angles from the trunk portion 33c thereof to bridge the space between the central and peripheral base film portions 3f and 3a at sides thereof adjacent to those at which the trunk portion 33c of the lead 33 is situated. These extensions 31a through 33a of the leads 31 through 33 are bonded to the bumps 1a at the middle portions 31d through 33d thereof which bridge the sides of the central and peripheral base film portions 3f and 3a and which are situated above the associated bumps 1a. The bumps 1a of the chip 1 can be electrically connected through extended leads 32 and 33 not only to the terminal portions 2b or an extension line 2c of the interconnection pattern 2a which are situated in close proximity thereto, but also to portions of the interconnection pattern 2a which are situated far away therefrom at other sides of the chip 1; in addition, the bumps 1a can be electrically connected with each other through such extended leads 32 and 33.

The assembling of the integrated circuit chip 1 on the electronic circuit board 2 utilizing the tape carrier 3 according to the present invention as shown in FIGS. 2a and 2b is effected as follows.

Before the mounting and bonding of the chip 1 is effected, the tape carrier utilized in the tape automated bonding according to the present invention comprises an elongated tape-shaped film of an electrically insulating flexible material such as polyimide on which a sequence of lead patterns of an electrically conducting material such as copper is formed by the photo-etching process, each pattern or set of leads of the sequence corresponding to the set of leads 3b and 30 through 33 shown in FIG. 2a. The elongated tape-shaped film also has a sequence of apertures formed therein by the photo-etching process, for example, each set of apertures in the sequence leaving in the tape-shaped film the square ring-shaped peripheral film portion 3a and the square central film portion 3f shown in FIGS. 2a and 2b; each set of apertures also leaves slender strips (not shown) which connect the peripheral portion 3a to the main portion (not shown) of the elongated tape-shaped film. The leads 3b and 30 through 33 are plated with tin, etc., at the inner lead portions 3c and at the bridging portions 31d through 33d of the extensions 31a through 33a of the extended leads 31 through 33, at which the leads 3b and 30 through 33 are bonded to the bumps 1a on the chip 1 by the inner lead bonding process as explained below. Further, outer lead portions 3d of the leads 3b and 30 through 33 extending into the apertures in the tape-shaped film around the peripheral film portion 3a are plated with a solder. The process of producing the above-described elongated tape-shaped film is conventional and well known, except for the geometry of the apertures and leads.

In the inner lead bonding process, the elongated tape-shaped film carrying a sequence of patterns of leads as described above is forwarded over the integrated circuit chips utilizing the perforations formed along the side areas of the tape-shaped film, so that one pattern of set of leads 3b and 30 through 33 as shown in FIG. 2a is positioned over an integrated circuit chip 1, the inner lead portions 3c and the bridging portions 31d through 33d thereof being aligned with the associated bumps 1a. Next, a heated bonding tool is pressed on the inner lead portions 3c and the bridging portions 31d through 33d plated with tin to form an alloy layer between the bumps 1a and the inner lead and bridging portions 3c and 31d through 33d, thereby effecting inner lead bonding by thermocompression. It is preferred that the height of the bumps 1a be greater than the thickness of the tape-shaped film carrying the leads 3b to ensure the bonding of the bridging portions 31d through 33d to the bumps 1a. However, the bonding of the bridging portions 31d through 33d to the bumps can be effected even if the height of the bumps 1a is smaller than the thickness of the lead carrying film 3a and 3f. The bonding can be effected by pressing and forming the bridging portions 31a through 33d of the extended leads 31 through 33 beforehand to bring them into contact with the associated bumps 1a of the chip 1.

Next, a portion of the elongated tape-shaped film comprising a set of peripheral and central film portions 3a and 3f and a set of leads 3b and 30 through 33 bonded to an integrated circuit chip 1 are cut out from the main portion of the elongated tape-shaped film and the leads 3b and 30 through 33 are formed to obtain the tape carrier 3 in the form shown in FIGS. 2a and 2b. The tape carrier 3 and the chip 1 are positioned at a predetermined location on the electronic circuit board 2 so that the outer lead portions 3d of the leads 3b and 30 through 33 are aligned on the associated terminal portions 2b or a line 2c of the interconnection pattern 2a on the circuit board 2. Further, the outer lead portions 3d are bonded to the portions 2b and 2c of the interconnection pattern 2 corresponding thereto in the outer lead bonding process by means of soldering, etc.

As set forth above, the tape carrier of FIGS. 2a and 2b according to the present invention has the following advantages. The leads 32 and 33 have extension 32a and 33a which extend from the electrically insulating central film portion 3f above the upper main surface 1b of the integrated circuit chip 1. These extensions 32a and 33a make it possible to connect the bumps 1a with each other and to connect some of them to portions of the interconnection pattern 2a on the board 2 which are situated far away therefrom. Further, the small extension 31a of the lead 31 reaching the upper surface of the central film portion 3f makes the bridging portion 31d which is subjected to the inner lead bonding process more secure than the free inner lead portions 3c of the leads 3b.

Figure 3:
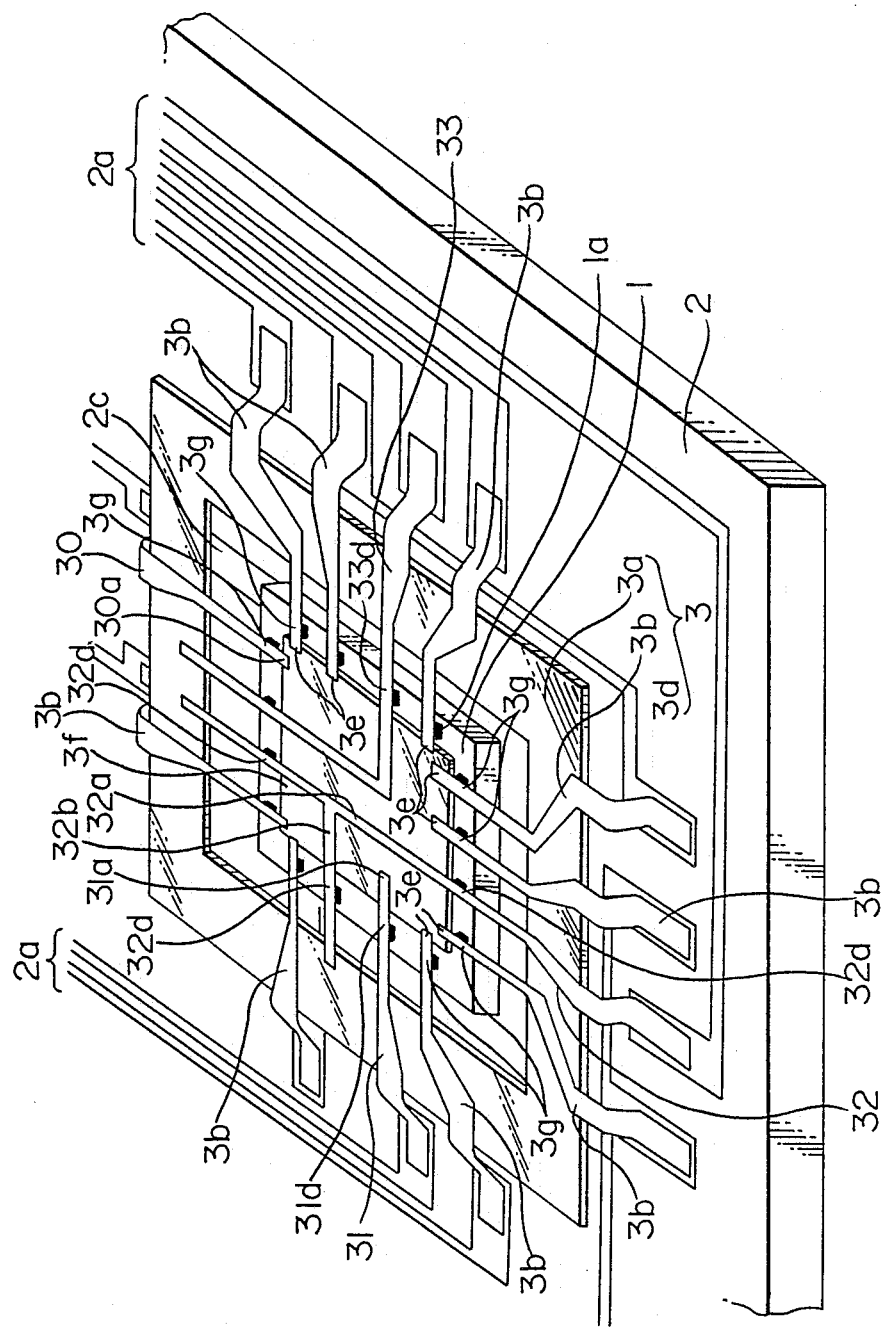
FIG. 3 is a view similar to that of FIG. 2a, but showing the second embodiment according to the present invention.

Thus, FIG. 3 shows a second embodiment of the tape carrier according to the present invention, in which all the leads 3b and 30 through 33 have extensions reaching the upper surface of the central base film portion 3f. Namely, not only the leads 32 and 33 for making interconnection of the bumps 1a and for making connections of the bumps 1a to far-away portions of the interconnection pattern 2a, but also other leads 3b, 30 and 31 have extensions 3e, 30a and 31a which extend into an area above the upper surface of the central film portion 3f. However these extensions 3e, 30a and 31a are short compared with the extensions 32a and 33a. In this embodiment, the portions 31d through 33d and 3g bonded to the bumps 1a are supported at both sides thereof, and no lead has free ends. Thus, the danger that the leads might be detached from the base film portions 3a and 3f or that they might be damaged at their free ends is minimized. The geometry of the leads shown in FIG. 3 is, therefore, effective in increasing the yield in the production of the tape carrier and in the assembling procedures of the integrated circuit chip utilizing the tape carrier. Except for those portions specifically described above, the tape carrier of FIG. 3 has a structure similar to that of FIGS. 2a and 2b and is utilized in a similar manner in the assembling of the integrated circuit chips.

In the embodiments described above, the central base film portion 3f situated on the upper main surface 1b of the chip 1 is disconnected from the peripheral film portion 3a by a square ring-shaped aperture. If it preferred, however, that the central portion 3f be connected to the peripheral portion 3a through slender film strips bridging the opposing angles of the central and peripheral film portions 3f and 3a so that the central portion 3f is securely connected to the central portion 3a, thereby making the production of the tape carrier easier and more efficient.

Figure 4:
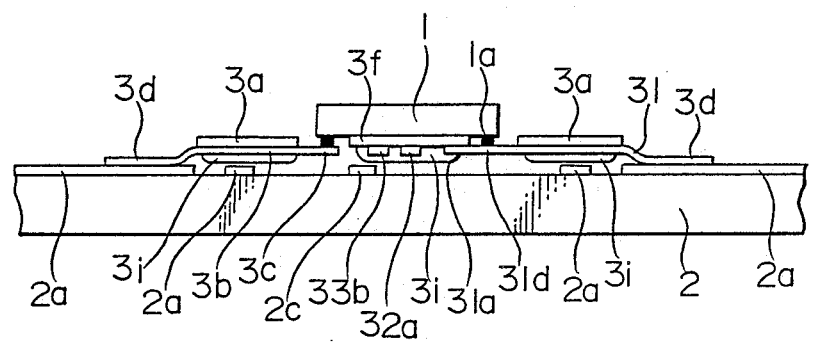
FIG. 4 is a view similar to that of FIG. 2b, but showing the third embodiment according to the present invention.

Further, in the embodiments described above, the tape carrier 3 carrying the integrated circuit chip 1 is positioned on the electronic circuit board 2 in such a way that the main surface 1b of the chip having the bumps 1a faces upward, i.e., in the direction opposite to the position of the board 2. It is possible, however, to position the tape carrier over the electronic circuit board in the assembling process in such a way that the main surface 1b of the chip 1 having the bumps 1a faces downward to oppose the electronic circuit board, as shown in FIG. 4. In the embodiment shown in FIG. 4, however, it is necessary to dispose an electrically insulating layer 3i on the leads 3b and 30 through 33 so that the leads 3b and 30 through 33 are electrically insulated from the interconnection pattern 2a formed on the circuit board 2.

Referring now to FIGS. 5a through 5d of the drawings, the fourth embodiment of the present invention is described.

Figure 5A:
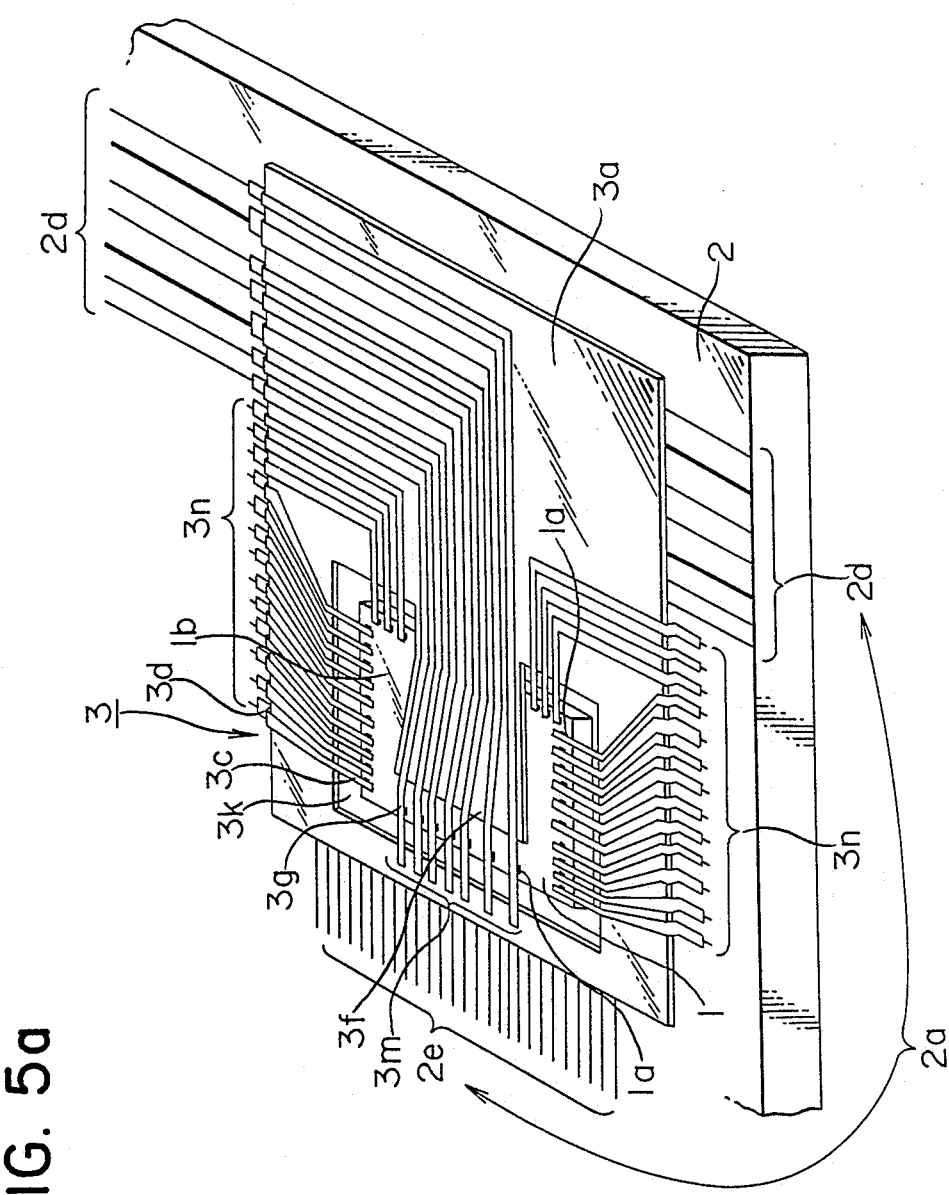

FIG. 5a shows an integrated circuit chip 1 mounted and bonded to a display panel substrate 2 having an electrically conducting interconnection pattern 2a formed thereon. The display panel substrate 2 may be liquid crystal display, an electrochromic display utilizing solids which change color when injected with positive or negative charges, or a electroluminescent display having electroluminescent segments which are activated by the application of voltage. The integrated circuit chip 1 has formed on the upper main surface 1b thereof a plurality of bumps 1a or projecting electrodes for input and output signals to and from the chip 1. The bumps 1a are made, for example, of gold.

The tape carrier 3 utilized to assemble the chip 1 on the display panel substrate 2 comprises a rectangular base film portion 3a having a substantially U-shaped aperture 3k formed therein into which a rectangular thick tongue-like base film appendage 3f extends to cover the central portion of the upper main surface 1b of the chip 1 on which circuit patterns, etc. are formed. The base film 3a is made of an electrically insulating material having a good heat resistant property, such as a polyimide resin. The tape carrier 3 further comprises the leads 3m and 3n made of a foil of an electrically conducting material such as copper which are formed on the base film portion 3a. The leads 3m transmit the control signals to and from the integrated circuit chip 1, while the leads 3n transmit the output signal from the chip 1 driving the display of the panel substrate 2. The leads 3m are bonded to the bumps 1a on the chip 1 at the left side thereof in the figure at the portions 3g of the leads 3m extending from the end side of the appendage 3f to the opposing strip of the base film portion 3a to bridge the aperture 3k. After running on the appendage 3f and a base portion of the base film 3a beneath which no bumps 1a are formed on the chip 1, the leads 3m are bonded to the lines 2d of the interconnection pattern 2a formed on the display panel substrate 2. The lines 2d connect to a plurality of integrated circuit chips mounted on the panel substrate 2 to transmit control signals or power to and from the integrated circuit chips, such as DC power, the clock signal, or the video signals. The leads 3n, on the other hand, are bonded to the bumps 1a of the chip 1 outputting the display pane driving signals. The leads 3n are bonded to the bumps 1a at the free end portions, i.e., the inner lead portions 3c thereof, the outer lead portions 3d of the leads 3n being bonded to the terminal portions of the lines 2e of the interconnection pattern 2a which transmit the display panel driving signals from the driving integrated circuit chip 1 to the associated picture elements (not shown) of the display panel substrate 2. The lines 2e are situated to the left in the figure.

Figure 5B:
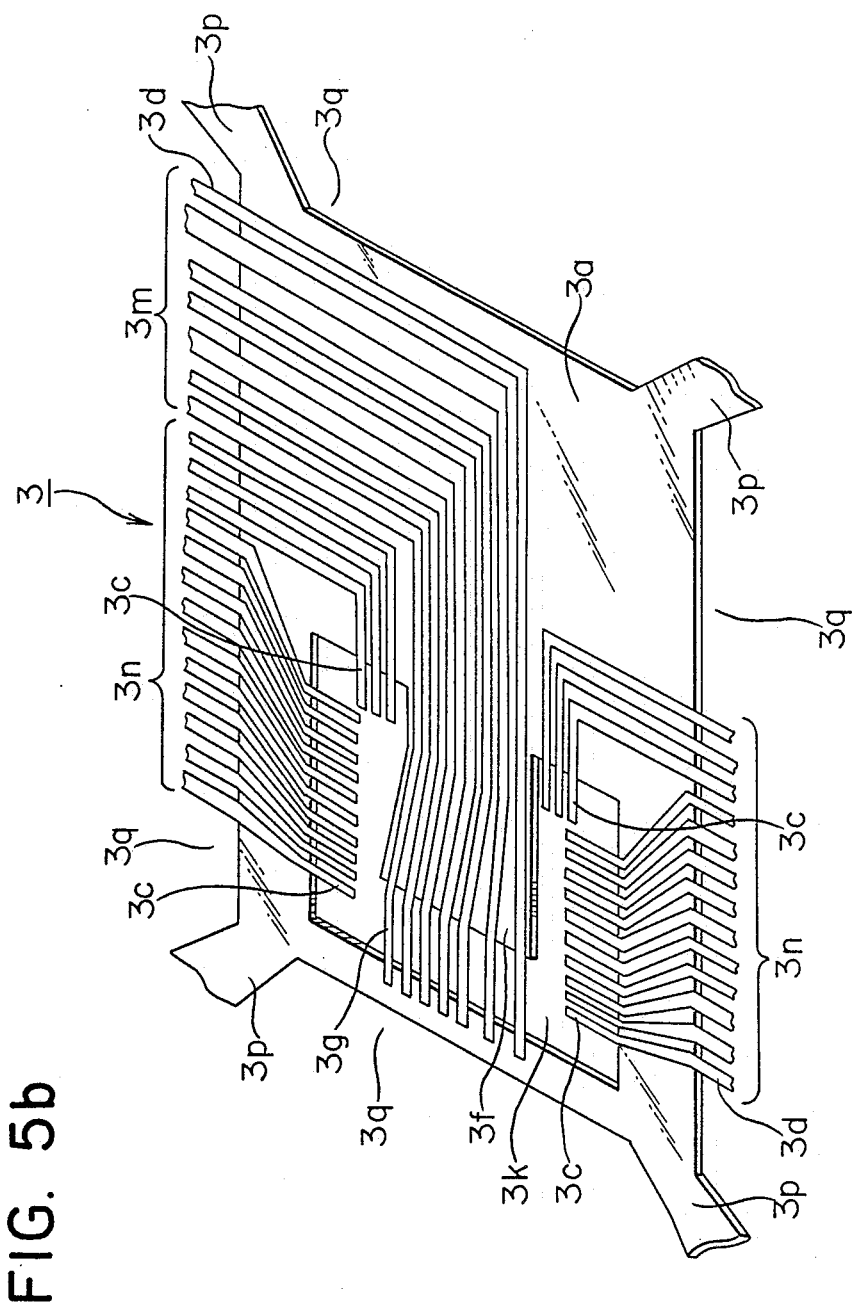
Figure 5C:
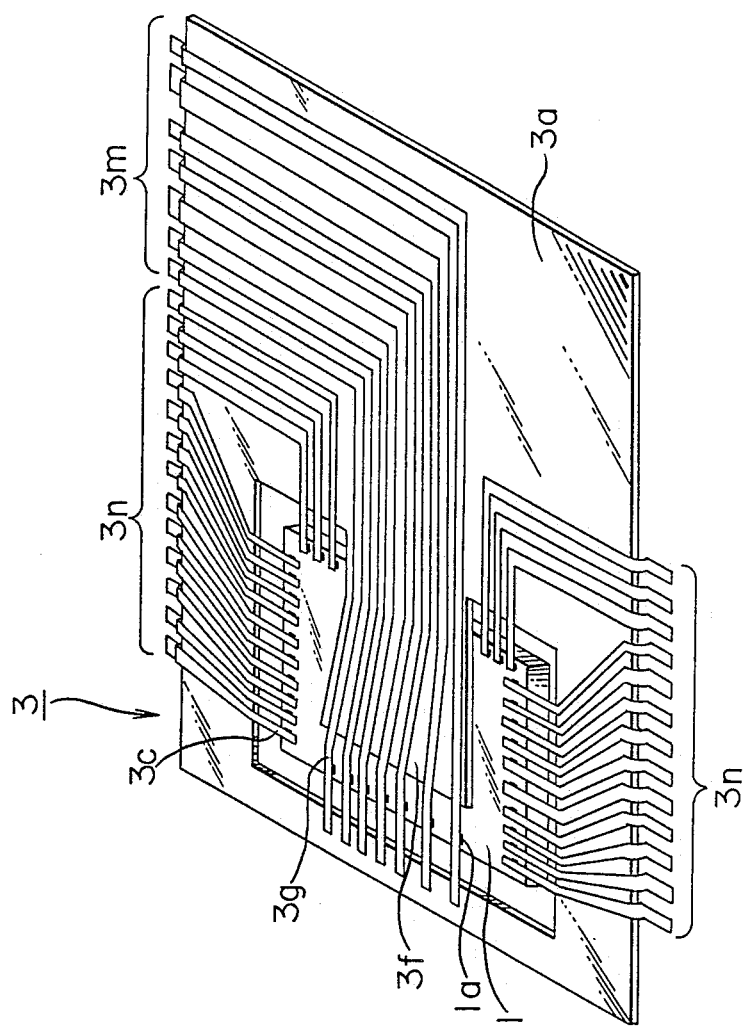
Figure 5D:
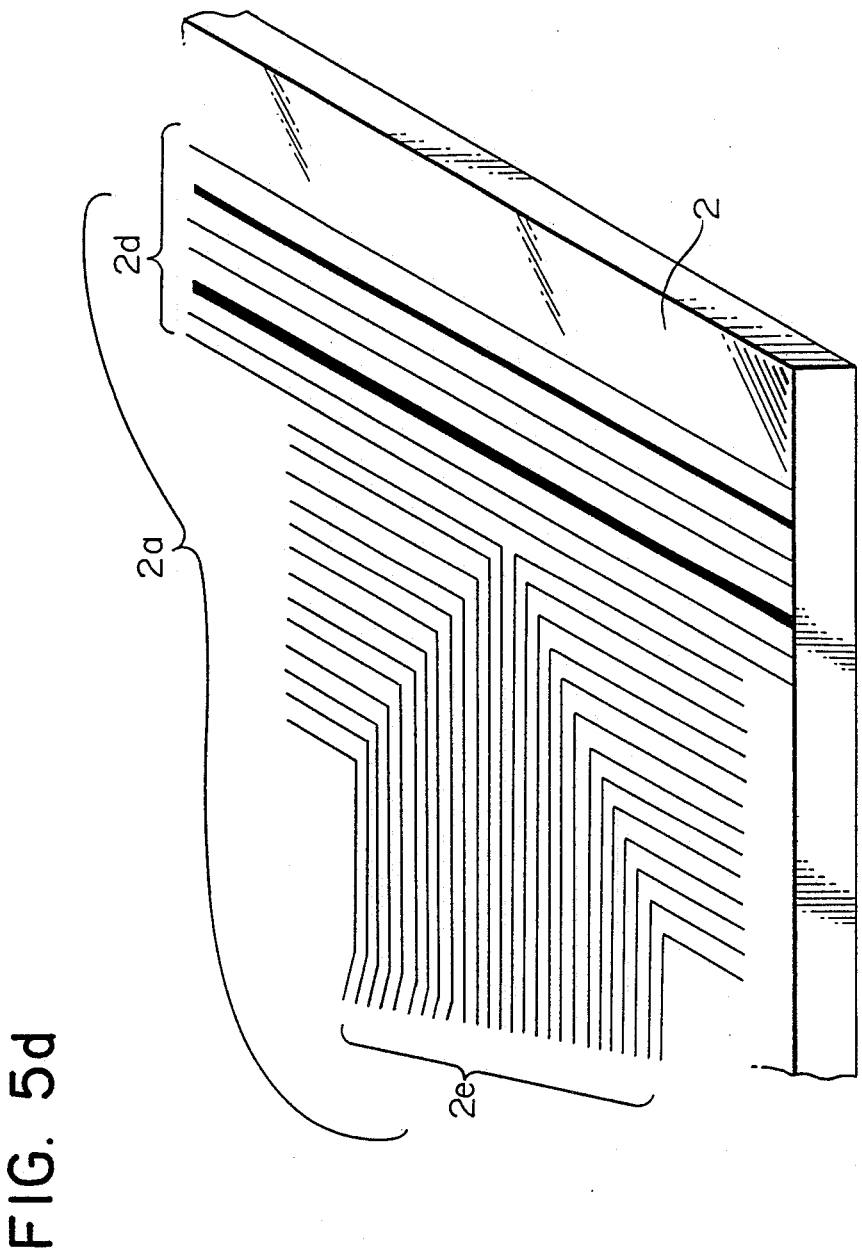

Referring next to FIGS. 5b through 5d of the drawings, the assembling procedure of the integrated circuit chip 1 on the display panel substrate 2 utilizing the tape carrier 3 according to the present invention is described.

At its first stage, the tape carrier utilized in the assembling process comprises an elongated tape-shaped film, a portion of which is shown in FIG. 5b. The portion of the tape carrier shown in the figure comprises a base film portion 3a having an appendage 3f extending in the aperture 3k and surrounded by peripheral apertures 3q. The portion 3a is connected to the main portion of the tape-shaped film (not shown) through the strips 3p extending across the peripheral apertures 3q. The leads 3m and 3n are plated with tin at the portions 3g and 3c thereof bonded to the bumps 1a in the inner lead bonding process, and with solder at the outer lead portions 3d thereof which extend out of the film portion 3a into the peripheral apertures 3q and which are to be bonded to the lines 2d and 2e of the interconnection pattern 2a of the display panel substrate 2 shown in FIG. 5d.

In the inner lead bonding process, each portion of the tape carrier 3 shown in FIG. 5b is positioned on an integrated circuit chip 1 so that the inner lead portions 3c and the bridging portions 3g of the leads 3n and 3m, respectively, are aligned on the associated bumps 1a of the chip 1. Next, the free inner lead portions 3c and the bridging portions 3g of the leads 3n and 3m are bonded to the associated bumps 1a by pressing and heating the portions 3c and 3g of the leads 3n and 3m on the bumps 1a utilizing a bonding too. Further, the portion of the tape carrier 3 shown in FIG. 5b is cut from the main portion of the tape-shaped film and the outer lead portions 3d of the leads 3m and 3n are formed, thereby obtaining an assemblage of the tape carrier 3 and the chip 1 shown in FIG. 5c.

Next, outer lead bonding is performed. The tape carrier 3 carrying the chip 1 as shown in FIG. 5c is positioned on the display panel substrate 2 on which an interconnection pattern 2a comprising the lines 2d and 2e are formed as shown in FIG. 5d, so that the outer lead portions 3d of the leads 3m and 3n are aligned on the associated lines 2d and 2e, respectively. Further, the outer lead portions 3d are heated and pressed on the associated lines 2d and 2e of the pattern 2a by a bonding tool so that the solder plating on the outer lead portions 3d of the leads 3m and 3n become molten to bond the outer lead portions 3d to the associated liens 2d and 2e of the interconnection pattern 2a on the substrate 2. As a result, the chip 1 is mounted and bonded to the substrate 2 as shown in FIG. 5a.

In the case of this fourth embodiment shown in FIG. 5a, the picture elements (not shown) of the display panel substrate 2 are situated to the left of the integrated circuit chip 1 in the figure at far ends of the lines 2e. However, the bumps 1a situated at the left side of the upper main surface 1b of the chip 1 are those for the control signals to and from the chip 1. Thus, the bumps 1a at the left side of the upper main surface 1b of the chip 1 are connected to the lines 2d for transmitting control signals by means of the leads 3m which extend on the appendage 3f of the base film 3a above the upper main surface 1b of the chip 1, the lines 2d for transmitting control signals being situated to the right side of the chip 1 in the figure. Thus, it is possible to draw the lines 2e for transmitting picture element driving signals under the display driving integrated circuit 1 and the base film portion 3a, leaving the scanning order of the display panel driving signal outputs of the integrated circuit chip 1 coincident with the wiring order of the electrodes of the picture elements. Thus, the area which is needed for making electrical connections of one integrated circuit chip 1 on the display panel substrate 2 can be minimized to realize a high-density assembling of integrated circuits on the substrate 2.

In the embodiments of FIGS. 2a and 2b through FIGS. 5a through 5d described above, the leads of the tape carrier 3 and the integrated circuit chip 1 are situated on the opposite sides of the base film portions of the tape carrier. The bumps of the integrated circuit chip 1 are bonded to the same surface of the leads of the tape carrier 3 which the leads are carried by the base film portions of the tape carrier 3. In the embodiments that follow, however, the leads of the tape carrier 3 and the integrated circuit chip 1 are on the same side of the base film portions.

Figure 6B:
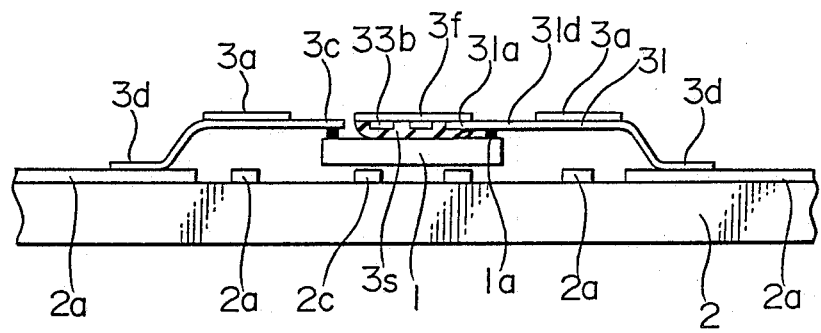

FIGS. 6a and 6b show a fifth embodiment of the present invention which is similar to that of FIGS. 2a and 2b. Thus, the integrated circuit chip 1 having the bumps 1a on the main surface 1b thereof and the electronic circuit board 2 having electrically conducting interconnection pattern 2a have the same structures and positional relations as those of the assembly of FIGS. 2a and 2b. Further, the base film portions 3a and 3f and the leads 3b and 30 through 33 of the tape carrier 3 have the same geometry and relative positional relations as those of the corresponding parts of the tape carrier 3 shown in FIGS. 2a and 2b except that the leads 3b and 30 through 33 are positioned under the base film portions 3a and 3f, instead of thereabove. Thus, the inner lead portions 3c and the extentions 31a through 33a of the leads 3b and 30 through 33 are at a vertical level between those of the main surface 1b of the chip 1 and the lower surface of the film portions 3a and 3f. Thus, to prevent undesirable electrical contacts of the extensions 31a through 33a of the leads 31 through 33 with the electrical circuit patterns, etc., formed on the main surface 1b of the chip 1, the tape carrier 3 of FIGS. 6a and 6b further comprises an electrically insulating layer 3s made, for example, of a polyimide of an epoxy resin which covers the lower surface of the central base film portion 3f and the portions of the extensions 31a through 33a of the leads 31 through 33 extending thereunder, as shown in FIG. 6b.

The assembling process of the integrated circuit chip 1 on the electronic circuit board 2 utilizing the tape carrier 3 of FIGS. 6a and 6b is also similar to that utilizing the tape carrier 3 of FIGS. 2a and 2b, except that an electrically insulating layer 3s is formed on the lower surface of each one of the central film portions 3f in the elongated tape-shaped film (not shown) to cover the extensions 31a through 33a of the leads 31 through 33 disposed thereon before the inner lead bonding step is performed.

Except for the points mentioned above, the tape carrier 3 of FIGS. 6a and 6b is similar to that of FIGS. 2a and 2b in structure and in the manner in which it is utilized in the assemblage of the integrated circuit chips. Thus, further details of the embodiment of FIGS. 6a and 6b are deemed unnecessary.

Figure 7:
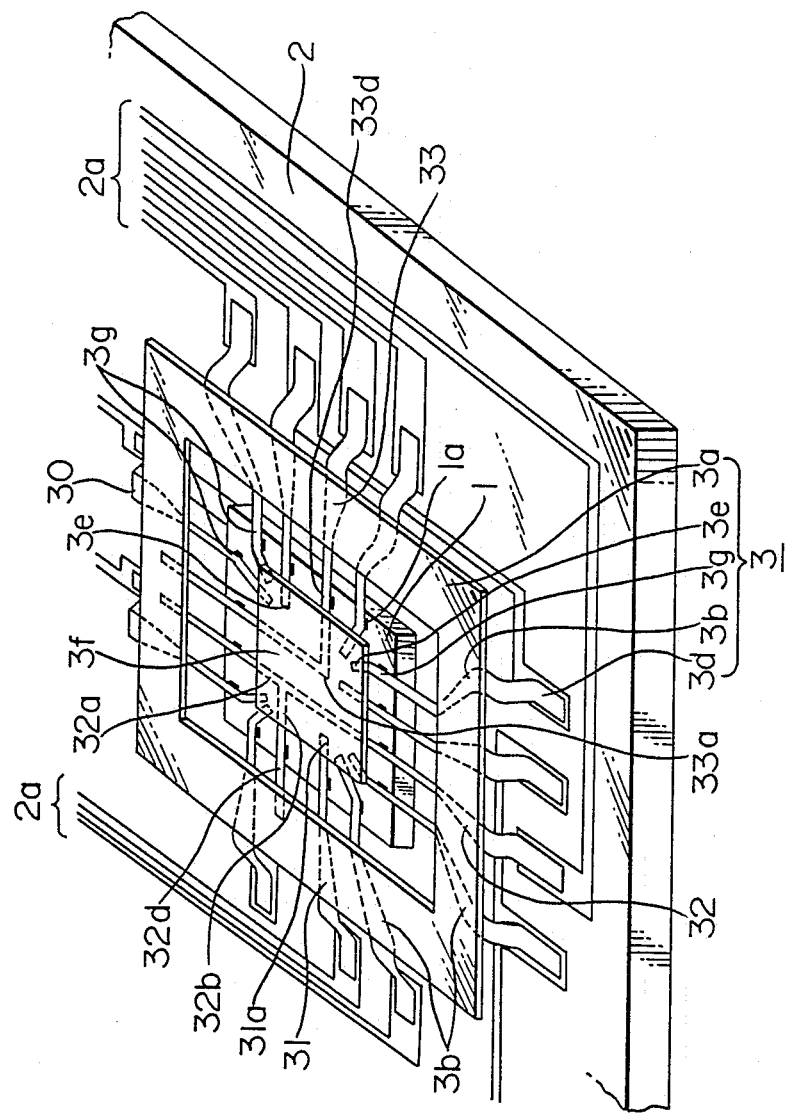
FIG. 7 is a view similar to that of FIG. 3, but showing the sixth embodiment similar to that of FIG. 3.

FIG. 7 shows a sixth embodiment of the present invention corresponding to that of FIG. 3. The tape carrier 3, as well as the chip 1 and the board 2, has the same structure and positional relations as that shown in FIG. 3, except that the leads 3b and 30 through 33 are positioned under the film portions 3a and 3f, and further, an electrically insulating layer corresponding to that 3s of the tape carrier 3 of FIGS. 6a and 6b is provided on the lower surface of the central film portion 3f to cover the extensions 3e and 31a through 33a of the leads 3b and 31 through 33. Thus, the tape carrier 3 of FIG. 7 has the same advantage over the tape carrier of FIGS. 6a and 6b as that of FIG. 3 over the tape carrier 3 of FIGS. 2a and 2b.

Figure 8:
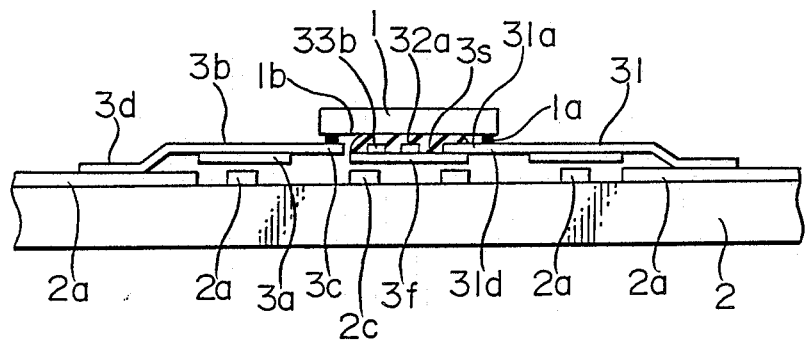
FIG. 8 is a view similar to that of FIG. 4, but showing the seventh embodiment according to the present invention similar to that of FIG. 4.

FIG. 8 shows a seventh embodiment of the present invention corresponding to that of FIG. 4. The main surface 1b having the bumps 1a of the chip 1 faces downward toward the upper surface of the electronic circuit board 2 on which the interconnection pattern 2a is formed. The electrically insulating layer 3s is disposed on the surface of the film portion 3f which faces upward in the figure to cover the extensions of leads carried on the film portion 3f. The central film portion 3f is situated between the extensions of the leads of the tape carrier 3 and the interconnection pattern 2a on the circuit 2, so that further electrical insulation is unnecessary.

Figure 9A:
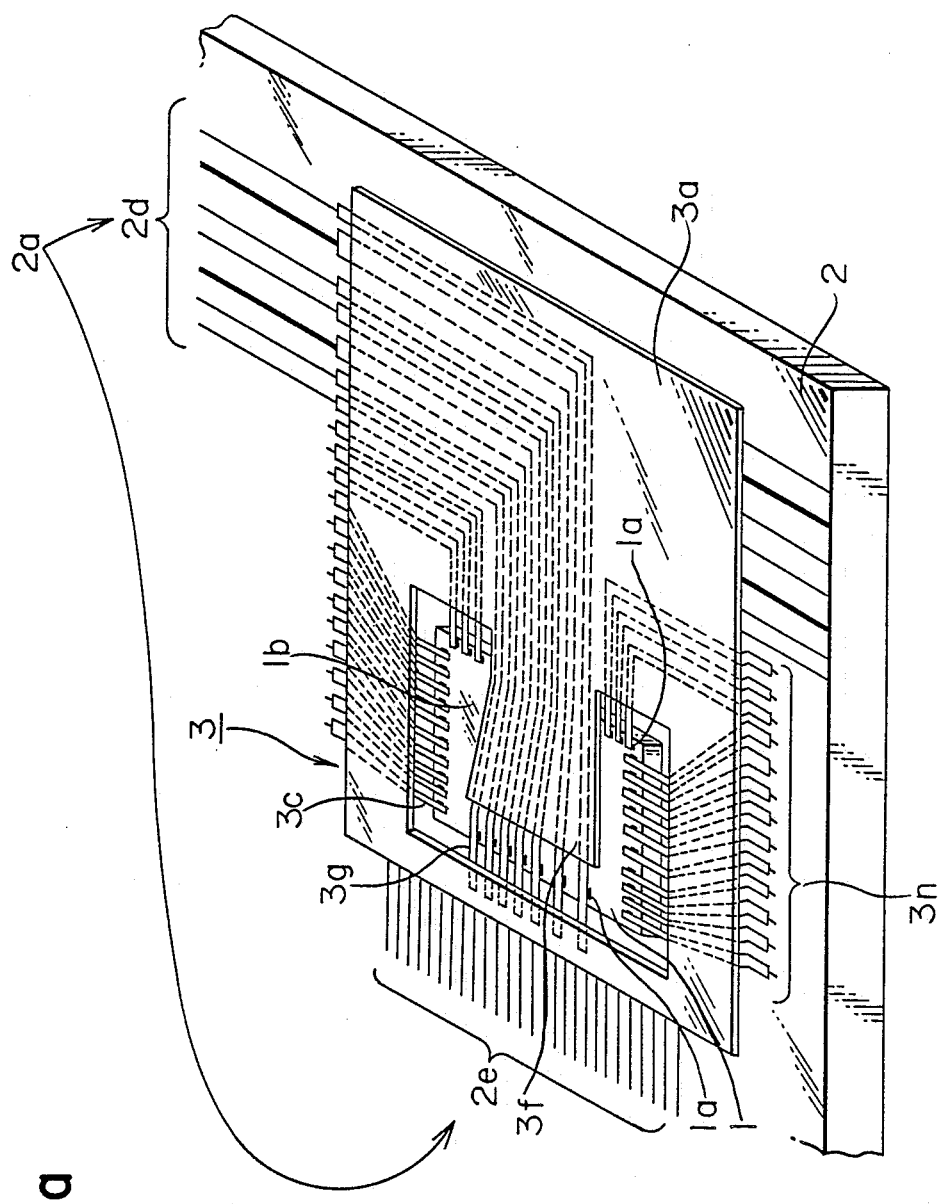
FIGS. 9a and 9c are views similar to those of FIGS. 5a through 5c, but showing the eighth embodiment according to the present invention similar to that of FIGS. 5a through 5d.
Figure 9B:
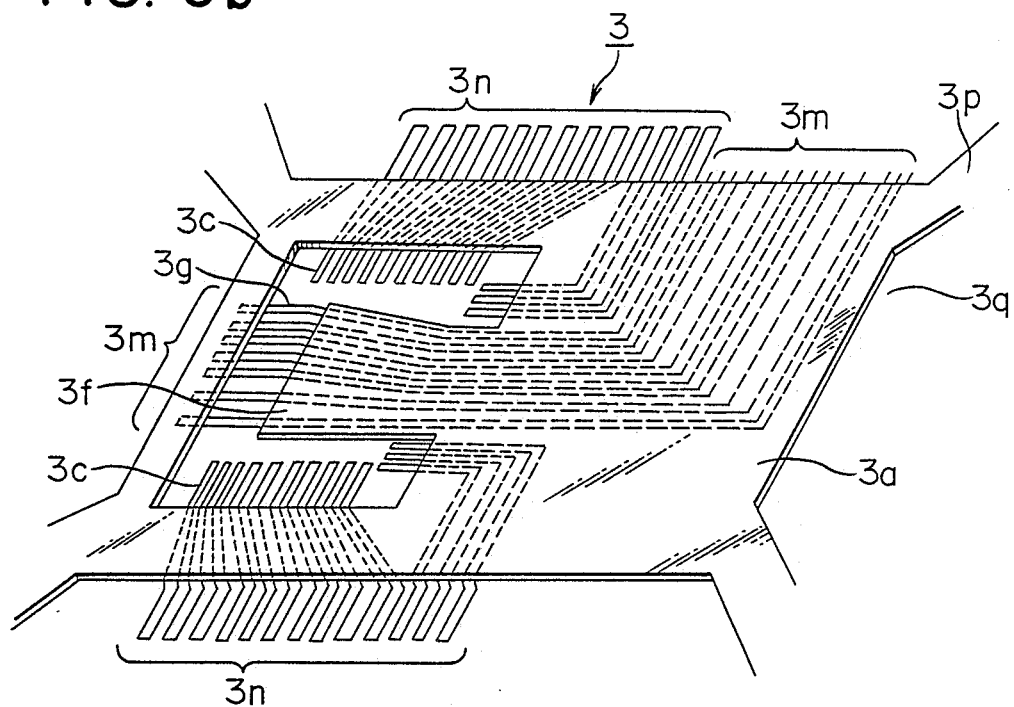
Figure 9C:
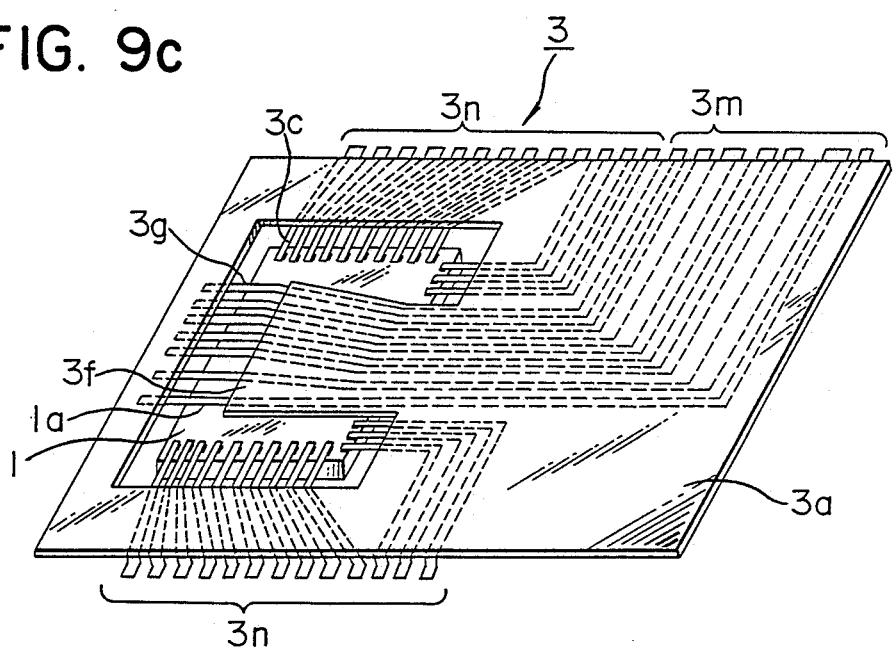

The eighth embodiment of the present invention shown in FIGS. 9a through 9c corresponds to that of FIGS. 5a through 5d. The integrated circuit chip 1 and the display panel substrate 2 have the same structure and relative positional relations as those of FIGS. 5a through 5d; the tape carrier 3 also has the same structure and relative positional relations as the tape carrier 3 thereof, except that the leads 3m and 3n are positioned under the film portion 3a, and, further, the lower surface of the appendage 3f of the film portion 3a situated above the upper main surface 1b of the chip 1 is covered by an electrically insulating layer (not shown) corresponding to that 3s shown in FIG. 6b. The process of assembling the chip 1 on the substrate 2 utilizing the tape carrier 3 of FIGS. 9a through 9c is similar to that utilizing the tape carrier 3 of FIGS. 5a through 5c, except that an electrically insulating layer corresponding to that 3s of FIG. 6b is formed on each one of the appendage 3f of the film portions 3a in the elongated tape-shaped film before the inner lead boding process is commenced.

What is claimed is:

1. A tape carrier for establishing a plurality of electrical connections between respective electrodes disposed on a surface of a semiconductor chip and external circuitry comprising:

a first electrically insulating film including a central opening in which a semiconductor chip having a surface on which a plurality of electrodes are disposed may be placed;

a plurality of unitary electrically conducting leads, each lead including an inner end projecting into the opening for connection to at least one electrode of the semiconductor chip, a central portion disposed on and supported by said first film, and an outer end for connection to external circuitry, the inner end of at least one of said unitary leads extending entirely across the opening for connection to at least two electrodes of the semiconductor chip and being additionally supported by said first film after crossing the opening; and a second electrically insulating film disposed within the opening, supporting and attached to said at least one unitary lead extending entirely across the opening, for disposition opposite the semiconductor chip intermediate the electrodes.

2. The tape carrier of claim 1 wherein the inner end of at least one of said leads not extending across the opening is disposed on and supported by the second film.

3. The tape carrier of claim 1 including a substrate on which a plurality of external leads are disposed, said outer ends of said leads being electrically connected to respective external leads.

4. The tape carrier of claim 3 wherein said second film is disposed opposite and facing said substrate.

5. The tape carrier of claim 3 wherein the semiconductor chip is disposed between said substrate and second film.

6. The tape carrier of claim 1 wherein said first film has opposed first and second sides including at least one of said leads disposed on and supported by the first side of said first film and at least a second of said leads disposed on and supported by the second side of said first film.

7. The tape carrier of claim 3 wherein said second film is disposed between said at least one lead crossing the opening and the semiconductor chip.

8. The tape carrier of claim 3 wherein said at least one unitary lead entirely crossing the opening is disposed between said second film and the semiconductor chip and including an electrically insulating body disposed between said at least one unitary lead entirely crossing the opening and the semiconductor chip.

9. A tape carrier for establishing a plurality of electrical connections between respective electrodes disposed on a surface of a semiconductor chip and external circuitry comprising:

an electrically insulating film including an opening in which a semiconductor chip having a surface on which a plurality of electrodes are disposed may be placed, said first film including an appendage projecting into the opening;

a plurality of unitary electrically conducting first leads, each first lead including an inner end projecting into the opening for connection to at least one electrode of the semiconductor chip, a central portion disposed on and supported by said first film, and an outer end for connection to external circuitry; and a plurality of unitary electrically conducting second leads extending from said appendage, each unitary second lead including an inner end extending entirely across the opening and being supported by said first film after entirely crossing the opening, a central portion disposed on and supported by said appendage, and an outer end for connection to external circuitry, each said inner end for connection to an electrode of the semiconductor chip intermediate the opening and said central portion.

10. The tape carrier of claim 9 including a substrate on which a plurality of external leads are disposed, said outer ends of said first and second leads being electrically connected to respective external leads.

11. The tape carrier of claim 9 wherein said film is disposed between the semiconductor chip and said first and second leads.

12. The tape carrier of claim 9 wherein said first and second leads are disposed between the chip and said film and including an electrically insulating body disposed between the semiconductor chip and said first and second leads.

* * * * *